(12) United States Patent
Chang et al.

(10) Patent No.: US 10,462,943 B2
(45) Date of Patent: Oct. 29, 2019

(54) ELECTRONIC DEVICE AND SHIELD THEREOF

(71) Applicant: Wistron NeWeb Corp., Hsinchu (TW)

(72) Inventors: Jen-Yung Chang, Hsinchu (TW); Tiao-Ming Hsu, Hsinchu (TW)

(73) Assignee: WISTRON NEWEB CORP., Hsinchu (TW)

( * ) Notice: Subject to any disclaimer, the term of this patent is extended or adjusted under 35 U.S.C. 154(b) by 161 days.

(21) Appl. No.: 15/706,535

(22) Filed: Sep. 15, 2017

(65) Prior Publication Data

US 2018/0263143 A1 Sep. 13, 2018

(30) Foreign Application Priority Data

Mar. 8, 2017 (TW) .............................. 106107514 A (51) Int. Cl.
| | |
|---|---|
| *H05K 9/00* | (2006.01) |
| *H05K 7/20* | (2006.01) |
| *H05K 3/34* | (2006.01) |
| *H05K 3/00* | (2006.01) |
| *H05K 1/02* | (2006.01) |

(52) U.S. Cl.
CPC ......... *H05K 9/0032* (2013.01); *H05K 3/3405* (2013.01); *H05K 7/20445* (2013.01); *H05K 9/0003* (2013.01); *H05K 9/0073* (2013.01); *H05K 1/0216* (2013.01); *H05K 3/0052* (2013.01); *H05K 2201/09* (2013.01); *H05K 2201/10371* (2013.01)

(58) Field of Classification Search
USPC .................................................. 361/816, 818
See application file for complete search history.

(56) References Cited

U.S. PATENT DOCUMENTS

| | | | | |
|---|---|---|---|---|
| 5,495,399 A * | 2/1996 | Gore | ..................... | H05K 9/0032 174/354 |
| 5,949,019 A * | 9/1999 | Sirainen | ............... | H05K 9/0016 174/354 |
| 6,870,091 B2 * | 3/2005 | Seidler | ................. | H05K 9/0032 174/382 |
| 6,949,706 B2 * | 9/2005 | West | ..................... | H05K 9/0032 174/384 |
| 7,285,732 B2 * | 10/2007 | Vinokor | ............... | H05K 9/0032 174/377 |
| 7,952,889 B2 * | 5/2011 | Chao | ...................... | H05K 1/144 174/350 |
| 8,303,051 B2 * | 11/2012 | Chen | ..................... | H05K 9/0049 312/223.2 |

(Continued)

*Primary Examiner* — Hung S. Bui (57) ABSTRACT

A shield is provided, including a frame and a cover. The frame includes a plurality of frame side walls and a frame top structure. Each frame side wall includes at least one frame side wall wedge. The frame side walls are connected to the frame top structure, and the frame top structure includes at least one cantilever beam. The cover includes a plurality of cover side walls and a cover top structure. Each cover side wall includes at least one cover side wall opening. The frame side wall wedge is adapted to be wedged into the cover side wall opening to restrict the movement of the cover in a first direction. The cover side walls are connected to the cover top structure. The cover top structure includes at least one cover top opening. The cantilever beam is wedged into and abuts the cover top opening.

20 Claims, 7 Drawing Sheets

(56) References Cited

U.S. PATENT DOCUMENTS 9,462,732 B2 * 10/2016 Robinson ............. H05K 9/0032
2016/0044835 A1 * 2/2016 Lee ..................... H05K 1/0216
                                                                     361/760

* cited by examiner

ELECTRONIC DEVICE AND SHIELD THEREOF

CROSS REFERENCE TO RELATED APPLICATIONS

This Application claims priority of Taiwan Patent Application No. 106107514, filed on Mar. 8, 2017, the entirety of which is incorporated by reference herein.

BACKGROUND OF THE INVENTION

Field of the Invention

The present invention relates to a shield, and in particular to a shield with improved reliability.

Description of the Related Art

Figure 1:
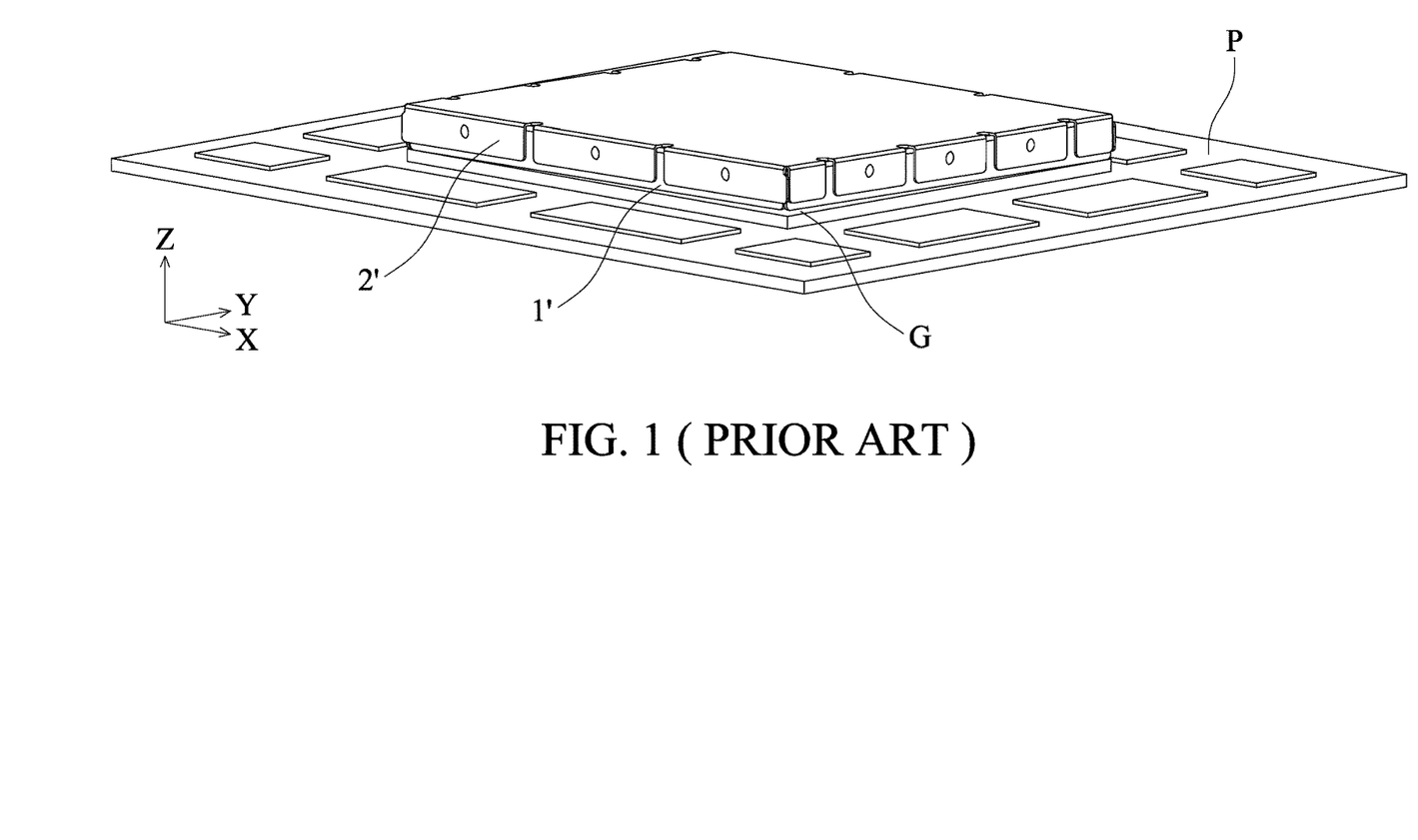
FIG. 1 shows a conventional shield.

FIG. 1 shows a conventional shield, which includes a frame 1' and a cover 2'. The cover 2' covers and connects to the frame 1'. The frame 1' is welded to a circuit board P with paste. The frame 1' includes a plurality of half-sphere-shaped protrusions. The cover 2' includes a plurality of wedging holes. The half-sphere-shaped protrusions are wedged into the wedging holes, and the cover 2' applies an inward stress (in the X direction and the Y direction) to the frame 1' to prevent the cover 2' from becoming separated from the frame 1'. However, when the conventional shield passes the secondary reflow furnace, the paste between the frame 1' and the circuit board P melts, and the inward stress (in the X direction and the Y direction) causes the shield to become deformed and tilt up from the circuit board. As shown in FIG. 1, a gap G is therefore formed between the frame 1' and the circuit board P.

BRIEF SUMMARY OF THE INVENTION

In one embodiment, a shield is provided, which is adapted to be fastened on a circuit board. The shield includes a frame and a cover. The frame includes a plurality of frame side walls and a frame top structure. Each frame side wall comprises at least one frame side wall wedge formed on the frame side wall. The frame side walls are connected to the frame top structure, and the frame top structure comprises at least one cantilever beam. The cover includes a plurality of cover side walls and a cover top structure. Each cover side wall comprises at least one cover side wall opening. The frame side wall wedge is adapted to be wedged into the cover side wall opening to restrict the movement of the cover in a first direction. The first direction is perpendicular to the circuit board. The cover side walls are connected to the cover top structure. The cover top structure comprises at least one cover top opening. The cantilever beam is partially wedged into and abuts the cover top opening. The cantilever beam applies a force to the cover in the first direction. The cantilever beam simultaneously restricts the movement of the cover in a second direction and a third direction. The second direction is perpendicular to the third direction. The second direction and the third direction are parallel to the circuit board.

In another embodiment, a shield is provided. The shield includes a frame and a cover. The frame includes a plurality of frame side walls and a frame top structure. Each frame side wall comprises at least one frame side wall wedge formed on the frame side wall. The frame side walls are connected to the frame top structure, and the frame top structure comprises at least one cantilever beam. The cover includes a plurality of cover side walls and a cover top structure. Each cover side wall comprises at least one cover side wall opening, and the frame side wall wedge is located in the cover side wall opening to restrict the movement of the cover in a first direction. The cover side walls are connected to the cover top structure, the cover top structure comprises at least one cover top opening, the cantilever beam is partially wedged into and abuts the cover top opening formed on the frame side wall, the cantilever beam applies a force to the cover in the first direction, and the cantilever beam simultaneously restricts the movement of the cover in a second direction and a third direction, wherein the second direction is perpendicular to the third direction, and the second direction and the third direction are perpendicular to the first direction.

In another embodiment, an electronic device is provided. The electronic device includes a circuit board and a shield welded to the circuit board. The shield includes a frame and a cover. The frame includes a plurality of frame side walls and a frame top structure. Each frame side wall comprises at least one frame side wall wedge formed on the frame side wall. The frame side walls are connected to the frame top structure, and the frame top structure comprises at least one cantilever beam. The cover includes a plurality of cover side walls and a cover top structure. Each cover side wall comprises at least one cover side wall opening. The frame side wall wedge is adapted to be wedged into the cover side wall opening to restrict the movement of the cover in a first direction. The first direction is perpendicular to the circuit board. The cover side walls are connected to the cover top structure. The cover top structure comprises at least one cover top opening. The cantilever beam is partially wedged into and abuts the cover top opening. The cantilever beam applies a force to the cover in the first direction. The cantilever beam simultaneously restricts the movement of the cover in a second direction and a third direction. The second direction is perpendicular to the third direction. The second direction and the third direction are parallel to the circuit board.

Utilizing the shield of the embodiment of the invention, only the stress in the first direction exists between the frame side walls and the cover side walls. Therefore, the cover side walls are prevented from pushing the frame side walls inwardly (in the second direction and the third direction). The internal stress in the second direction and the third direction between the frame and the cover only exists between the cantilever beam and the cover top opening. Additionally, due to the characteristic of the cantilever beam, the internal stress in the second direction and the third direction between the frame and the cover only deforms the cantilever beam rather than deforming the other portions of the frame. Thus, the tilted up problem of the conventional shield due to the internal stress in the second direction and the third direction between the frame and the cover is prevented.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 2A:
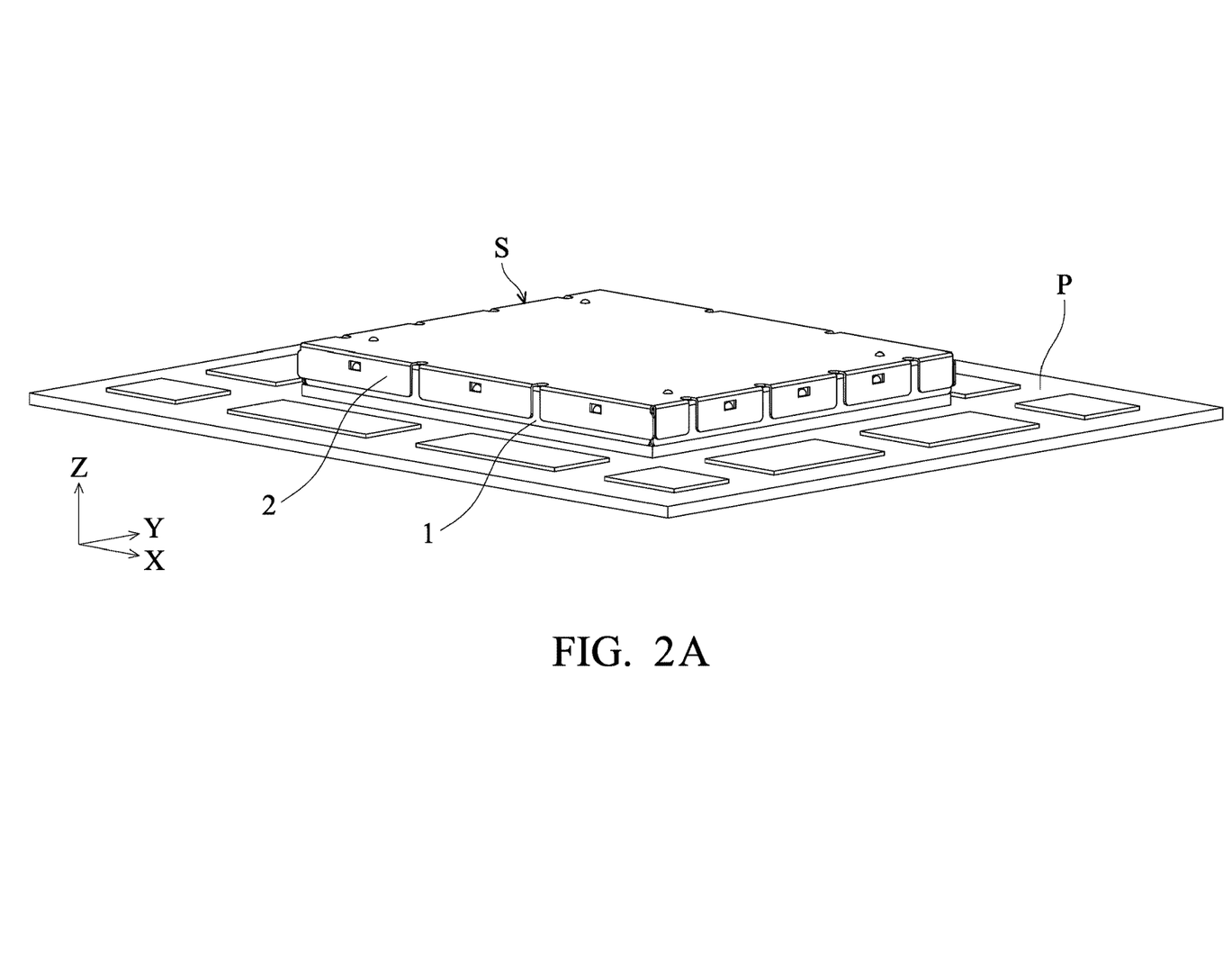
FIG. 2A is an assembled view of a shield of an embodiment of the invention.
Figure 2B:
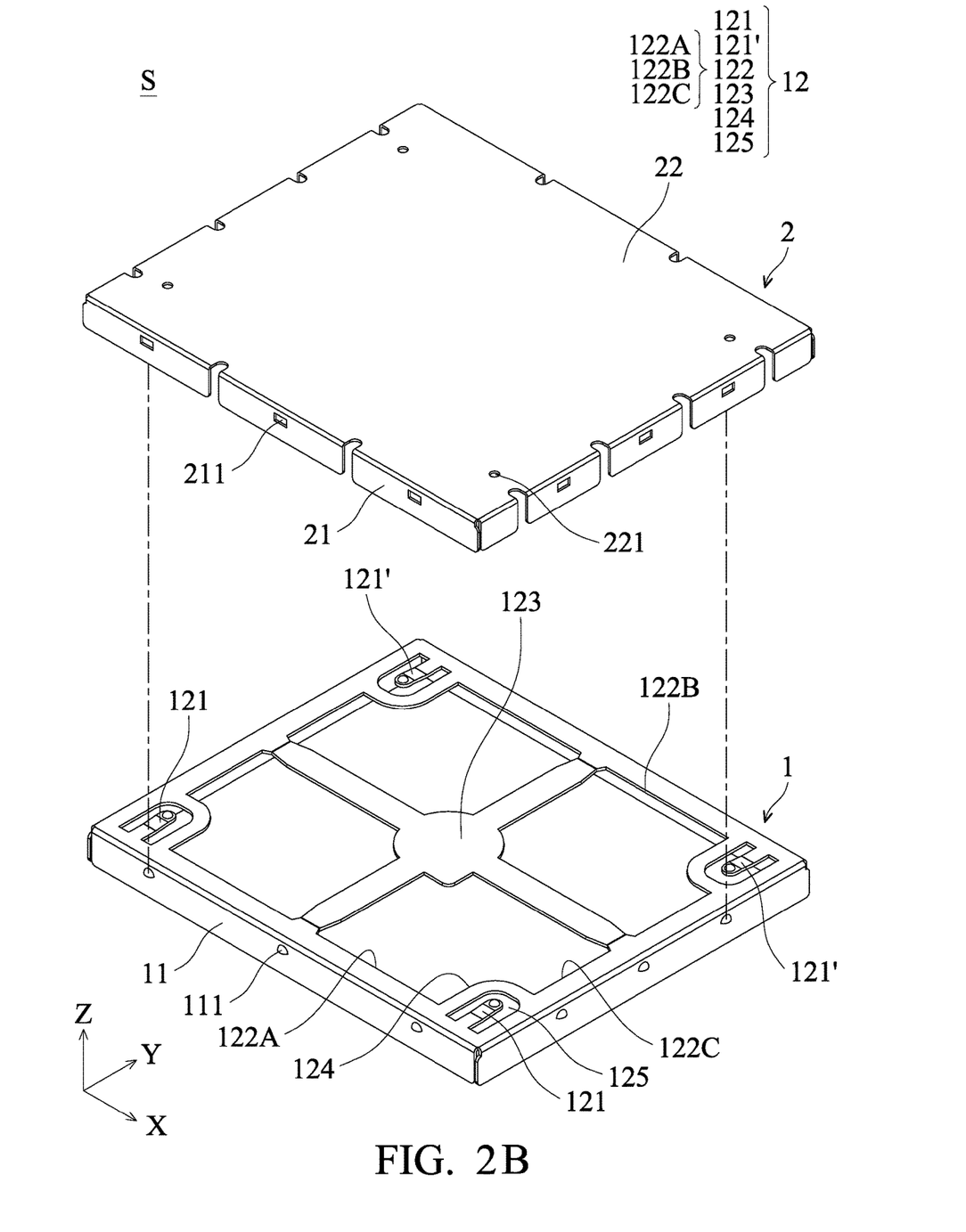
FIG. 2B is an exploded view of the shield of the embodiment of the invention.

FIG. 2A is assembled view of the shield S of the embodiment of the invention. FIG. 2B is an exploded view of the shield S of the embodiment of the invention. With reference to FIGS. 2A and 2B, the shield S of the embodiment of the invention is adapted to be fastened on a circuit board P. The shield S includes a frame 1 and a cover 2. The frame 1 includes a plurality of frame side walls 11 and a frame top structure 12. Each frame side wall 11 comprises at least one frame side wall wedge 111 formed on the frame side wall 11. Optionally, the frame side wall wedge 111 can be integrally formed on the frame side wall 11. The frame side walls 11 are connected to the edges of the frame top structure 12. The frame top structure 12 comprises at least one cantilever beam 121. The cover 2 includes a plurality of cover side walls 21 and a cover top structure 22. Each cover side wall 21 comprises at least one cover side wall opening 211. The frame side wall wedge 111 is adapted to be wedged into the cover side wall opening 211 to restrict the movement of the cover 2 in a first direction Z away from the circuit board P. The first direction Z is perpendicular to the circuit board P. The cover side walls 21 are connected to the edges of the cover top structure 22. The cover top structure 22 comprises at least one cover top opening 221. The cantilever beam 121 is wedged into and abuts the cover top opening 221. The cantilever beam 121 applies a force to the cover 2 in the first direction Z. The cantilever beam 121 restricts the movement of the cover 2 in a second direction X and a third direction Y simultaneously. The second direction X is perpendicular to the third direction Y. The second direction X and the third direction Y are parallel to the circuit board P.

In one embodiment, the frame 1 is welded to the circuit board P.

Figure 3A:
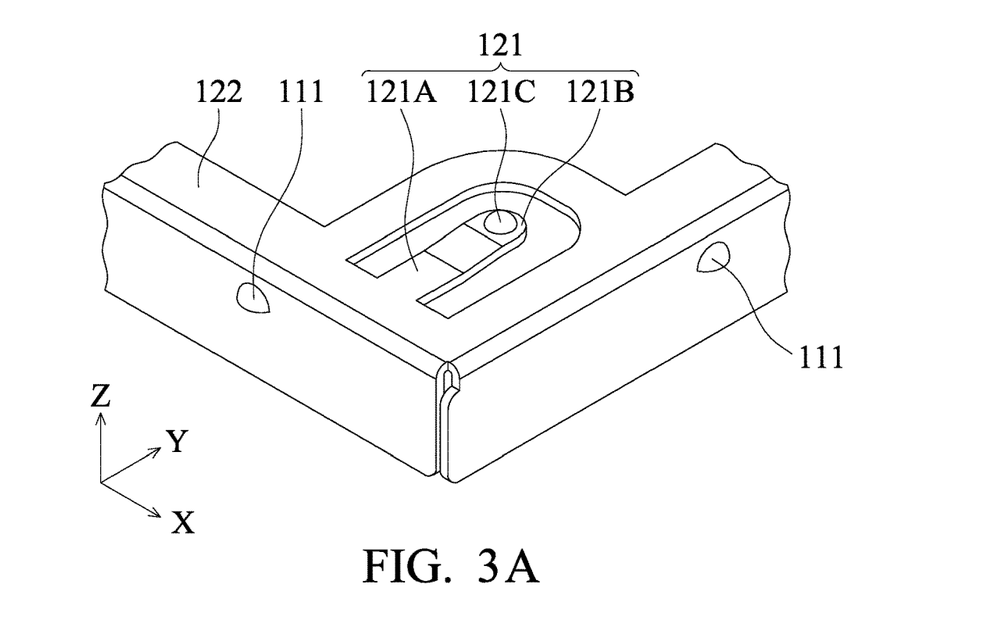
FIG. 3A shows the details of the cantilever beam of the embodiment of the invention.
Figure 3B:
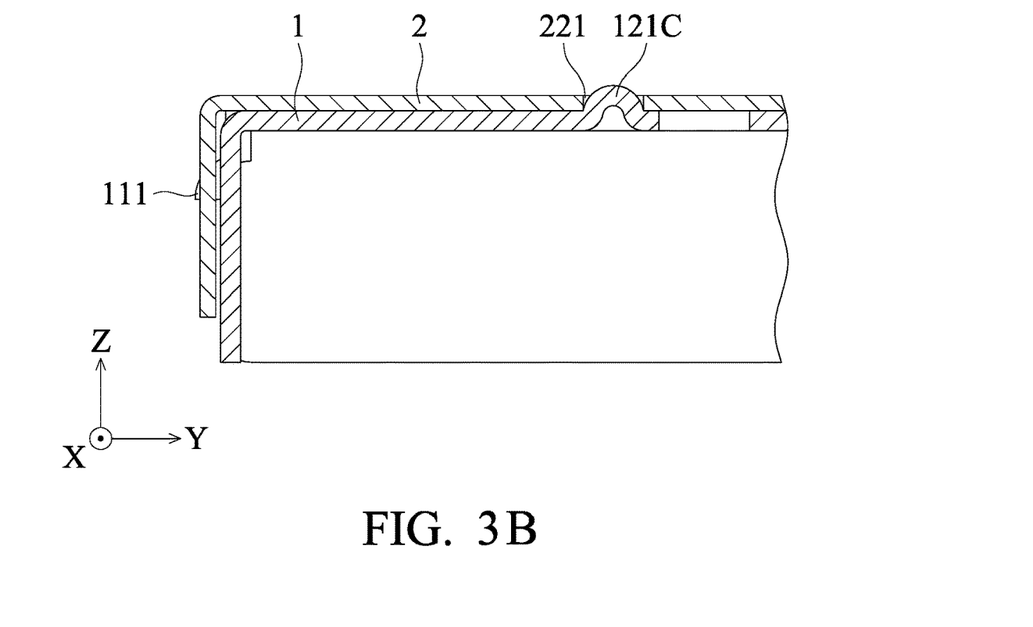
FIG. 3B is a cross sectional view of the cantilever beam of the embodiment of the invention.

With reference to FIGS. 3A and 3B, in one embodiment, the frame top structure 12 comprises a top frame body 122. The cantilever beam 121 comprises a connection end 121A, a free end 121B and a top wedging protrusion 121C. The connection end 121A is connected to the top frame body 122. The top wedging protrusion 121C is formed on the free end 121B. The top wedging protrusion 121C is wedged into the cover top opening 221. The top wedging protrusion 121C applies force to the cover 2 in the first direction Z. The top wedging protrusion 121C restricts the movement of the cover 2 in the second direction X and the third direction Y.

Figure 4A:
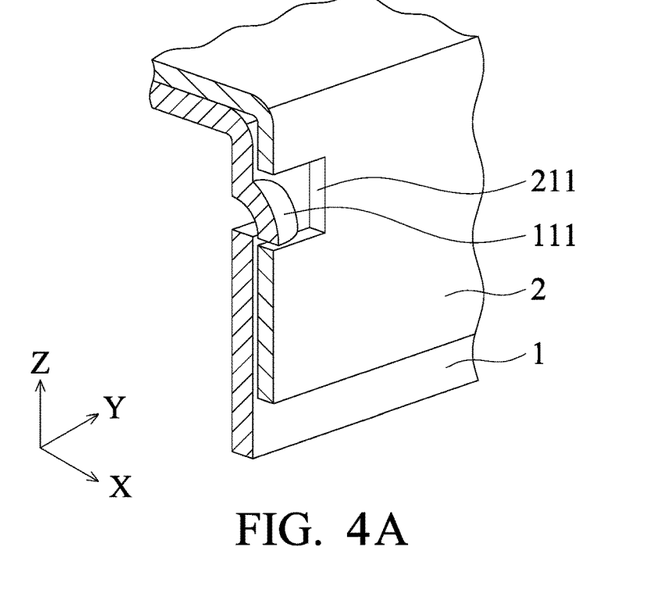
FIG. 4A shows the details of a side wall wedge and a side wall opening of the embodiment of the invention in a transition state.
Figure 4B:
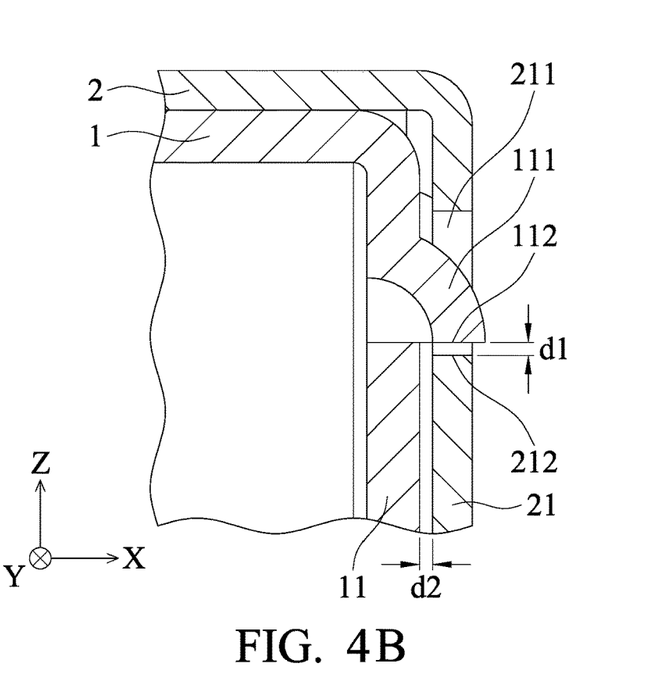
FIG. 4B is a cross sectional view of the side wall wedge and the side wall opening of the embodiment of the invention in the transition state.
Figure 4C:
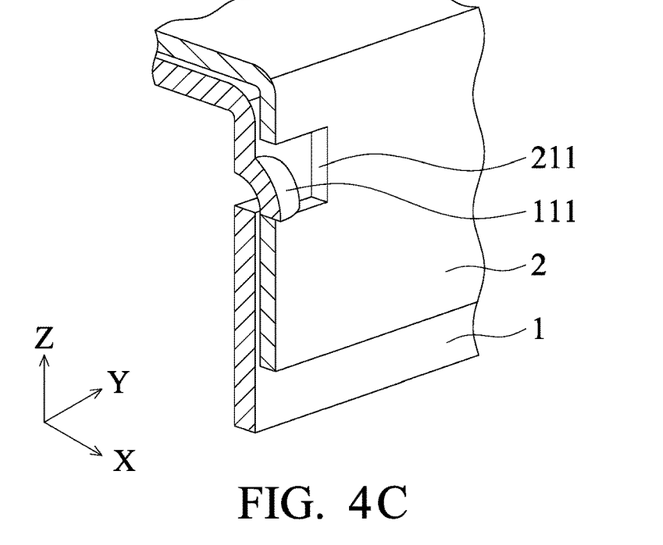
FIG. 4C shows the details of a side wall wedge and a side wall opening of the embodiment of the invention in a complete state.
Figure 4D:
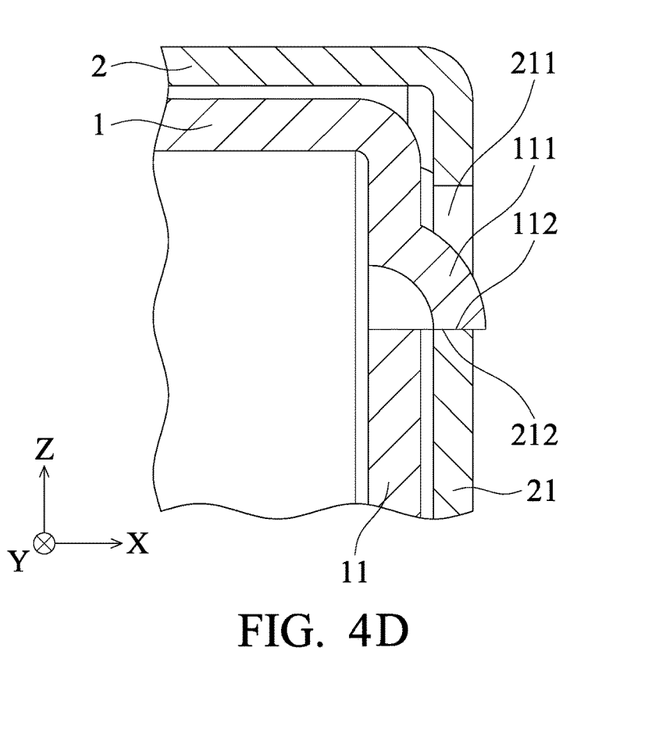
FIG. 4D is a cross sectional view of the side wall wedge and the side wall opening of the embodiment of the invention in the complete state.

With reference to FIGS. 4A and 4B, in one embodiment, the frame side wall wedge 111 is a protrusion, the protrusion (111) is separated from an inner wall of the cover side wall opening 211 in the second direction X and the third direction Y. With reference to FIGS. 4A and 4B, in a transition state, a first gap d1 is formed between a first abutting surface 112 of the frame side wall wedge 111 and a second abutting surface 212 of the cover side wall opening 211. In one embodiment, the first gap d1 can be 0.55 mm. With reference to FIGS. 3B, 4C and 4D, in a complete state, the top wedging protrusion 121C pushes the cover 2 in the first direction Z, and the first abutting surface 112 abuts the second abutting surface 212.

With reference to FIGS. 4C and 4D, in the complete state, the frame side wall wedge 111 is separated from the inner wall of the cover side wall opening 211 in the second direction X and the third direction Y. Additionally, a second gap d2 is formed between at least a portion of the frame side walls 11 and at least a portion of the cover side walls 21. In the embodiment, the upper edge of the frame side wall wedge 111 is separated from the lower edge of the cover side wall opening 211 (FIG. 4D), and the second gap d2 exists between the frame side walls 11 and the cover side walls 21. Therefore, even a portion of the frame side walls 11 contacts a portion of the cover side walls 21, the frame side walls 11 are prevented from applying the stress to the cover side walls 21 in the second direction X and the third direction Y.

Figure 5:
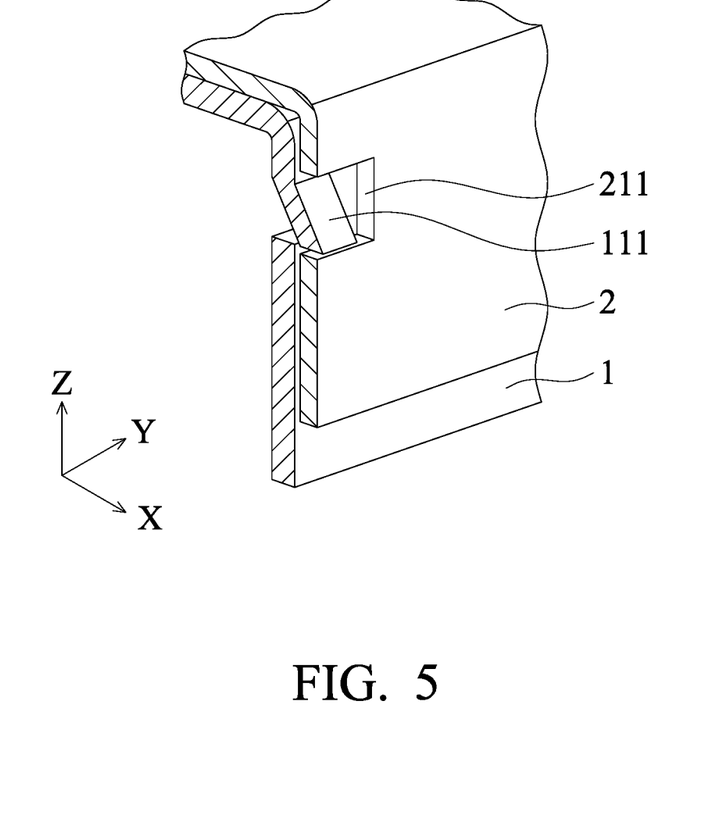
FIG. 5 shows a side wall wedge of another embodiment of the invention.

In the embodiment above, the frame side wall wedge 111 is a quarter-sphere-shaped structure. However, the disclosure is not meant to restrict the invention. With reference to FIG. 5, in another embodiment, the frame side wall wedge 111 can be wedge-shaped structure or other structures. Additionally, a frame side wall opening may replace the frame side wall wedge, and a cover side wall wedging protrusion may replace the cover side wall opening. Any structure with the feature that the upper edge of the frame side wall wedge 111 is separated from the lower edge of the cover side wall opening 211 and the second gap d2 exists between the frame side walls 11 and the cover side walls 21 can prevent internal stress applies to the cover side walls 21 in the second direction X and the third direction Y.

Utilizing the shield of the embodiment of the invention, only the stress in the first direction Z exists between the frame side walls 11 and the cover side walls 21. Therefore, the cover side walls 21 are prevented from pushing the frame side walls 11 inwardly (in the second direction X and the third direction Y). The internal stress in the second direction X and the third direction Y between the frame 1 and the cover 2 only exists between the cantilever beam 121 and the cover top opening 221. Additionally, due to the characteristic of the cantilever beam 121, the internal stress in the second direction X and the third direction Y between the frame 1 and the cover 2 only deforms the cantilever beam 121 rather than deforming the other portions of the frame 1. Thus, the problem of the conventional shield tilting up due to internal stress in the second direction X and the third direction Y between the frame and the cover is solved.

In the embodiment described above, though the frame side wall wedge 111 is separated from the inner wall of the cover side wall opening 211 in the second direction X and the third direction Y, the disclosure is not meant to restrict the invention. For example, due to the assembly error, the frame side wall wedge 111 may contact the cover side wall opening 211 in the second direction X or the third direction Y. However, as long as the upper edge of the frame side wall wedge 111 is separated from the lower edge of the cover side wall opening 211, the cover side walls 21 are prevented from pushing the frame side walls 11 inwardly (in the second direction X and the third direction Y).

With reference to FIG. 2B, in one embodiment, the frame top structure 12 is polygon-shaped. The cantilever beams 121 are integrally formed on the four respective corners of the frame top structure 12. In one embodiment, the cantilever beams include two first cantilever beams 121 and two second cantilever beams 121'. The first cantilever beams 121 are connected to a first inner side 122A of the top frame body 122, and the second cantilever beams 121' are connected a second inner side 122B of the top frame body 122. The first inner side 122A corresponds to the second inner side 122B. The first cantilever beams 121 respectively correspond to the second cantilever beams 121'. The extending direction of the first cantilever beams 121 is opposite to the extending direction of the second cantilever beams 122'. Utilizing the symmetrical design above, the stress between the frame and the cover is uniformed, and stress concentration is prevented. The frame top structure 12 can also be triangle or pentagon, for example, and the cantilever beams 121/121' are integrally formed on the respective corners of the frame top structure 12.

With reference to FIG. 2B, in one embodiment, the frame top structure 12 is polygon-shaped. The frame top structure 12 comprises a stage structure 123. The stage structure 123 is cross-shaped. The stage structure 123 is connected to the inner side of the top frame body 122. In one embodiment, the frame top structure 12 comprises a plurality of supporting portions 124, the supporting portions 124 surround at least a portion of the cantilever beam (121, 121'), and a U-shaped slot 125 is formed between the cantilever beam (121, 121'), the supporting portion 124 and the top frame body 122. The supporting portion 124 is a belt structure. The two ends of the supporting portion 124 connect the two inner sides of the top frame body 122 which are perpendicular to each other. For example, one end of the supporting portion 124 is connected to the first inner side 122A of the top frame body 122, and the other end of the supporting portion 124 is connected to the third inner side 122C of the top frame body 122. The first inner side 122A is adjacent to the third inner side 122C. The supporting portions increase the strength and the reliability of the shield.

Use of ordinal terms such as "first", "second", "third", etc., in the claims to modify a claim element does not by itself connote any priority, precedence, or order of one claim element over another or the temporal order in which acts of a method are performed, but are used merely as labels to distinguish one claim element having a certain name from another element having the same name (but for use of the ordinal term).

While the invention has been described by way of example and in terms of the preferred embodiments, it should be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A shield adapted to be fastened on a circuit board, comprising:
    a frame, comprising:
        a plurality of frame side walls, wherein each frame side wall comprises at least one frame side wall wedge formed thereon; and
        a frame top structure, wherein the frame side walls are connected to the frame top structure, and the frame top structure comprises at least one cantilever beam; and
    a cover, comprising:
        a plurality of cover side walls, wherein each cover side wall comprises at least one cover side wall opening, the frame side wall wedge is adapted to be wedged into the cover side wall opening to restrict the movement of the cover in a first direction, and the first direction is perpendicular to the circuit board; and
        a cover top structure, wherein the cover side walls are connected to the cover top structure, the cover top structure comprises at least one cover top opening, the cantilever beam is partially wedged into and abuts the cover top opening, the cantilever beam applies a force to the cover in the first direction, and the cantilever beam simultaneously restricts the movement of the cover in a second direction and a third direction, wherein the second direction is perpendicular to the third direction, and the second direction and the third direction are parallel to the circuit board.

2. The shield as claimed in claim 1, wherein the frame top structure comprises a top frame body, the cantilever beam comprises a connection end, a free end and a top wedging protrusion, the connection end is connected to the top frame body, the top wedging protrusion is formed on the free end, the top wedging protrusion is wedged into the cover top opening and abuts the edge thereof, the top wedging protrusion applies force to the cover in the first direction, the top wedging protrusion restricts the movement of the cover in the second direction and the third direction.

3. The shield as claimed in claim 1, wherein the frame side wall wedge is a protrusion, and the protrusion is separated from an inner wall of the cover side wall opening in the second direction and the third direction.

4. The shield as claimed in claim 3, wherein in a transition state, a gap is formed between a first abutting surface of the frame side wall wedge and a second abutting surface of the cover side wall opening facing the first abutting surface, and in a complete state, the top wedging protrusion pushes the cover in the first direction, and the first abutting surface abuts the second abutting surface.

5. The shield as claimed in claim 4, wherein the frame side wall wedge is a quarter-sphere-shaped structure.

6. The shield as claimed in claim 1, wherein the frame top structure is polygon-shaped, and each cantilever beam is integrally formed on each corner of the frame top structure.

7. The shield as claimed in claim 1, wherein the cantilever beams comprise two first cantilever beams and two second cantilever beams, the first cantilever beams are connected to a first inner side of the top frame body, and the second cantilever beams are connected a second inner side of the top frame body, the first inner side corresponds to the second inner side, the first cantilever beams respectively correspond to the second cantilever beams, and an extending direction of the first cantilever beams is opposite to an extending direction of the second cantilever beams.

8. The shield as claimed in claim 1, wherein the frame top structure comprises a stage structure, the stage structure is cross-shaped, and the stage structure is connected to an inner side of the top frame body.

9. The shield as claimed in claim 1, wherein the frame top structure comprises a plurality of supporting portions, the supporting portions surround at least a portion of the cantilever beam, and a U-shaped slot is formed between the cantilever beam, the supporting portion and the top frame body.

10. The shield as claimed in claim 9, wherein the supporting portion is a belt structure, one end of the supporting portion is connected to the first inner side of the top frame body, and the other end of the supporting portion is connected to a third inner side of the top frame body, and the first inner side is adjacent to the third inner side.

11. The shield as claimed in claim 1, wherein the frame is welded to the circuit board.

12. A shield, comprising:
 a frame, comprising:
  a plurality of frame side walls, wherein each frame side wall comprises at least one frame side wall wedge formed thereon; and
  a frame top structure, wherein the frame side walls are connected to the frame top structure, and the frame top structure comprises at least one cantilever beam; and
 a cover, comprising:
  a plurality of cover side walls, wherein each cover side wall comprises at least one cover side wall opening, and the frame side wall wedge is located in the cover side wall opening to restrict the movement of the cover in a first direction; and
  a cover top structure, wherein the cover side walls are connected to the cover top structure, the cover top structure comprises at least one cover top opening, the cantilever beam is partially wedged into and abuts the cover top opening, the cantilever beam applies a force to the cover in the first direction, and the cantilever beam simultaneously restricts the movement of the cover in a second direction and a third direction, wherein the second direction is perpendicular to the third direction, and the second direction and the third direction are perpendicular to the first direction.

13. An electronic device, comprising:
 a circuit board; and
 a shield welded to the circuit board, comprising:
  a frame, comprising:
   a plurality of frame side walls, wherein each frame side wall comprises at least one frame side wall wedge formed thereon; and
   a frame top structure, wherein the frame side walls are connected to the frame top structure, and the frame top structure comprises at least one cantilever beam; and
  a cover, comprising:
   a plurality of cover side walls, wherein each cover side wall comprises at least one cover side wall opening, the frame side wall wedge is adapted to be wedged into the cover side wall opening to restrict the movement of the cover in a first direction, and the first direction is perpendicular to the circuit board; and
   a cover top structure, wherein the cover side walls are connected to the cover top structure, the cover top structure comprises at least one cover top opening, the cantilever beam is partially wedged into and abuts the cover top opening, the cantilever beam applies a force to the cover in the first direction, and the cantilever beam simultaneously restricts the movement of the cover in a second direction and a third direction, wherein the second direction is perpendicular to the third direction, and the second direction and the third direction are parallel to the circuit board.

14. The electronic device as claimed in claim 13, wherein the frame top structure comprises a top frame body, the cantilever beam comprises a connection end, a free end and a top wedging protrusion, the connection end is connected to the top frame body, the top wedging protrusion is formed on the free end, the top wedging protrusion is wedged into the cover top opening and abuts the edge thereof, the top wedging protrusion applies force to the cover in the first direction, and the top wedging protrusion restricts the movement of the cover in the second direction and the third direction.

15. The electronic device as claimed in claim 13, wherein the frame side wall wedge is a protrusion, and the protrusion is separated from an inner wall of the cover side wall opening in the second direction and the third direction.

16. The electronic device as claimed in claim 15, wherein in a transition state, a gap is formed between a first abutting surface of the frame side wall wedge and a second abutting surface of the cover side wall opening facing the first abutting surface, and in a complete state, the top wedging protrusion pushes the cover in the first direction, and the first abutting surface abuts the second abutting surface.

17. The electronic device as claimed in claim 16, wherein the frame side wall wedge is a quarter-sphere-shaped structure.

18. The electronic device as claimed in claim 13, wherein the frame top structure is polygon-shaped, and each cantilever beam is integrally formed on each corner of the frame top structure.

19. The electronic device as claimed in claim 13, wherein the cantilever beams comprise two first cantilever beams and two second cantilever beams, the first cantilever beams are connected to the first inner side of the top frame body, and the second cantilever beams are connected the second inner side of the top frame body, the first inner side corresponds to the second inner side, the first cantilever beams respectively correspond to the second cantilever beams, and the extending direction of the first cantilever beams is opposite to the extending direction of the second cantilever beams.

20. The electronic device as claimed in claim 13, wherein the frame top structure comprises a stage structure, the stage structure is cross-shaped, and the stage structure is connected to the inner side of the top frame body.

* * * * *